United States Patent [19]

Nishimura et al.

[11] Patent Number: 5,336,378
[45] Date of Patent: Aug. 9, 1994

[54] METHOD AND APPARATUS FOR PRODUCING A HIGH-PURITY TITANIUM

[75] Inventors: Eiji Nishimura; Masami Kuroki, both of Saitama; Naoyuki Kikutake, Tokyo; Yuuichiro Shindou, Saitama, all of Japan

[73] Assignee: Japan Energy Corporation, Tokyo, Japan

[21] Appl. No.: 942,347

[22] Filed: Sep. 9, 1992

Related U.S. Application Data

[63] Continuation of Ser. No. 684,484, Apr. 12, 1991, abandoned, which is a continuation of Ser. No. 475,491, Feb. 6, 1990, abandoned.

[30] Foreign Application Priority Data

Feb. 15, 1989 [JP] Japan .................................. 1-33848
Dec. 6, 1989 [JP] Japan ................................. 1-315196

[51] Int. Cl.$^5$ .............................................. C25C 3/28
[52] U.S. Cl. ............................ 204/64 T; 204/243 R; 75/612; 75/621; 419/61
[58] Field of Search ............... 204/64 T, 243 R, 245, 204/225, 222; 75/612, 621

[56] References Cited

U.S. PATENT DOCUMENTS

| | | | |
|---|---|---|---|
| 2,939,823 | 6/1960 | Rand | 204/64 T |
| 2,944,949 | 7/1960 | Leech | 204/64 T |
| 3,114,685 | 12/1963 | Alpert | 204/64 T |
| 4,090,924 | 5/1978 | Bon | 204/64 T |
| 4,118,291 | 10/1978 | Juckniess et al. | 204/64 T |
| 4,165,262 | 8/1979 | Juckniess et al. | 204/64 T |
| 4,686,025 | 8/1987 | Cohen et al. | 204/245 |
| 5,054,421 | 10/1991 | Ito et al. | 204/298.36 |

FOREIGN PATENT DOCUMENTS 62-294177 12/1987 Japan.
62-294179 12/1987 Japan.

Primary Examiner—Kathryn Gorgos
Attorney, Agent, or Firm—Armstrong, Westerman, Hattori, McLeland & Naughton

[57] ABSTRACT

A sputtering target for forming a thin film consisting of high-purity titanium, in which the content of alkali metal is 0.1 ppm or less, the content of radio active elements is 1 ppb or less, and the oxygen content is 100 ppm or less, and, further, the balance of the elements is Ti, is produced by a fused salt electrolysis, in which the members of the electrolytic cell being in contact with the fused salt consist of Ni.

16 Claims, 3 Drawing Sheets

METHOD AND APPARATUS FOR PRODUCING A HIGH-PURITY TITANIUM

This application is a continuation of application Ser. No. 684,484, filed Apr. 12, 1991, now abandoned, which was a continuation of Ser. No. 475,491 filed Feb. 6, 1990, now abandoned.

BACKGROUND OF INVENTION

2. Field of the Invention

The present invention relates to a method and apparatus for producing a high-purity titanium. The present invention also relates to a high-purity titanium target for sputtering. Particularly, the present invention relates to a production of a high-purity titanium which has a purity appropriate for producing a semiconductor device by using the titanium target.

2. Description of Related Arts

Along with a high integration of LSIs, attention has been focused on the high melting-point metals, such as molybdenum, titanium and tungsten.

Particularly, in the case of titanium, which is one of the high melting-point metals, its utilization as metallic Ti, TiSi, TiN and the like has attracted interest ("VLSI Production Technique" (in Japanese) Nikkei BP Co., Ltd. Published on Jan. 14, 1989, page 167). Particularly, TiSi can be used as a barrier metal of an Si-gate NOS transistor, which is a subject of interest. In addition, there are attempts to substitute titanium for aluminum, heretofore used as conductors of LSIs and NOS electrodes. Research is advanced particularly in the use of titanium as a conductor having a fine pattern. A representative method for forming the barrier metals, conductors and the like by using titanium, is sputtering, in which a target made of titanium is sputtered in an argon atmosphere.

The titanium target is produced by shaping, sintering, and melting commercially available titanium, followed by machining.

In order to enhance the performance-reliability of the components of a semiconductor device, such impurities as follows must be decreased.

(1) Alkali metals such as Na, K, Li and the like
(2) Radio active elements such as U, Th and the like
(3) Heavy metals such as Fe, Cr and the like
(4) Oxygen The alkali metals, such as Na and K, move easily in the gate-insulation layer of MOS transistor and become a cause of deterioration in the properties of interface between the insulation layer and Si. Radio-active elements such as U emit rays therefrom, thereby causing the soft error of LSI memory. Heavy metals such as Fe also cause trouble at the bonding interface. Oxygen incurs deterioration of properties of MOS transistor.

The purity of a titanium target used for producing recent 1MDRAMs and 4MDRAMs is 5N (99.999%) except for the gaseous components. More specifically, the content of alkali metals, must be 0.1 ppm or less for each of Na, K and the like. The content of radio active elements must be 1 ppb or less for each of U, Th, and the like. The content of heavy metals must be 0.5 ppm or less for each of Fe, Cr and the like. The oxygen content must be 150 ppm or less, preferably 100 ppm or less.

Pure titanium, which is industrially produced at present, contains a large amount of the above mentioned alkali metals, heavy metals and gaseous components. Pure titanium having such a poor level of purity cannot be used in the field of semiconductors.

Japanese Unexamined Patent Publications Nos. 62-294177 and 62-294179 describe a thermal decomposition method of titanium iodide, for further purifying industrially produced titanium. This method, however, involves limitations in the refined purity. That is, the Fe content in the examples of these publications is 50 ppm, and hence is exceedingly higher than the required level.

The above method is, therefore, not suitable for producing the semiconductors. In addition, the thermal decomposition method is inherently adapted for a laboratory scale and is not suitable for industrial production. This is because the titanium-deposition rate is too small, for example, 0.225 g of Ti per hour.cm$^2$. Provided that the diameter of a titanium plate is 10 cm, 176 g of titanium is obtained in 10 hours, i.e., only 17.6 g of titanium is obtained per hour. In the thermal decomposition method of titanium iodide, induction heating is used to maintain the decomposition at a high temperature, i.e., 1100° to 1500° C. The deposition amount of titanium per electric power is 0.59 g/kwh, a very small amount. As is described above, the thermal decomposition method of titanium iodide involves limitations in purity, and low productivity, and, is further, extremely expensive.

Another known method is the fused-salt electrolytic method. The fused-salt electrolytic method has been studied up to now for electrolytic extraction of titanium from difficult to reduce titanium ore. Consideration was also made as to how to refine sponge titanium by means of the above method. For example, in "Bureau of Mines" (1957, pages 1–43) the following method is described (c.f. "Report of Investigation"). The mixed salt of LiCl-KCl is admitted in a crucible made of iron and is fused. The TiCl$_4$ is first blown onto the Ti strips which are put in the molten salt. An iron basket, in which the sponge Ti is contained, and a Ti cathode, are admitted in the fused salt. The electrolysis between the Ti sponge as the anode and the Ti cathode is carried out while using TiCl$_2$ as the carrier, thereby depositing pure titanium on the Ti cathode. The Fe content of pure titanium deposited by the above described method is 200 ppm and hence is very high. Electrolysis, which is similar to the one described above, is carried out in the other apparatus using a cell made of soft steel. The Fe content of pure titanium deposited in this apparatus is 110 ppm. It is impossible in any one of the apparatuses to attain the refinement at the level of Fe<1 ppm, since the iron content obtained by the above methods is extremely high.

The present inventors instead considered an iron crucible or container made of such materials as stainless steel or graphite, which can withstand the fused salt containing TiCl$_4$ and TiCl$_2$. Any one of such materials is, however, subjected erosion caused by the fused salt when it reaches a high temperature of from 500° to 850° C. and is partially dissolved, thereby causing the contamination of deposited titanium. The refined products contain oxygen at a high content, as well.

SUMMARY OF THE INVENTION

Considering the above state of the art, it is an object of the present invention to provide a titanium-refining technique, in which the refined titanium has a satisfactorily high purity for use in sputtering for producing a semiconductor device, and which is industrially profitable.

It is a particular object of the present invention to provide a highly purified titanium target, in which the content of elements detrimental to the performance of a semiconductor device, i.e., not only alkali metals, radio active metals, and heavy metals, but also oxygen, is extremely low.

The present inventors conceived of the idea that the fused salt electrolytic method is optimum in principle for attaining the objects. The present inventors considered various materials capable of being used in fused salt electrolysis, and discovered unexpectedly that nickel is appropriate as a constructional material of various parts and members of a fused salt electrolytic plant. Because of weak strength, the use of nickel as a constructional material is not usually considered. It initially seemed for the present inventors that, if nickel is used as the constructional material of an electrolysis apparatus, although the Ni amount transferred to the cathode would be small because it is a noble metal, transfer to some extent is inevitable. It unexpectedly turned out that Ni does not contaminate titanium.

In accordance with the present invention, there is provided a method for producing a high-purity titanium, in which a raw material consisting of metallic titanium is subjected to electrolysis by fused salt in an electrolytic apparatus, at least portions of which being in contact with the fused salt consist of a high-purity nickel.

There is also provided an electrolytic apparatus for producing a high-purity titanium by electrolyzing, in fused salt, a raw material consisting of metallic titanium, characterized in that at least portions of the electrolytic apparatus being in contact with the fused salt, consist of high-purity nickel.

There is also provided an electrolytic apparatus for producing a high-purity titanium according to the above wherein the apparatus comprises: a pipe, which is in slidable contact with an electrode in the form of a bar, or a bar, which is in slidable contact with an electrode in the form of a pipe; a sleeve member comprising portions divided in the direction of the electrode, each portion consisting of polytetrafluoroethylene, inserted at the contact part between the electrode and the pipe or bar, for electrically insulating therebetween at the contact part; and, a packing sandwiched between the divided portions of the sleeve member.

There is further provided a fused-salt electrolyzed titanium, whose content of radio active element is 0.1 ppm or less, content of heavy metal is 0.5 ppm or less and oxygen content is 100 ppm or less.

There is also provided a sputtering target for forming a thin film consisting of titanium, whose content of alkali metal is 0.1 ppm or less, content of radio active element is 1 ppb or less, content of heavy metal is 0.5 ppm or less, and oxygen content is 100 ppm or less.

The cathode is preferably made of Ti. High-purity Ti can be obtained even if Ni is used as the cathode. However, when the titanium, which is electro-deposited on the Ni cathode, is peeled off the cathode, Ni may be shaved off the cathode. There is no such danger when Ti is used for the cathode. The electrolyzed titanium which furthermore has a high purity, in particular 0.2 ppm or less of the heavy metal content, and has a stable quality, can be produced by covering the bottom of an electrolytic cell with an electrically insulating plate, which is not chemically corroded by the fused salt.

In accordance with the present invention, there is also provided a method for producing a high-purity titanium, in which a raw material consisting of metallic titanium is subjected to a fused salt electrolysis in an electrolytic apparatus, a cathode of which consists of Ti, and at least portions of which (except for the cathode) being in contact with the fused salt, consist of a high-purity nickel.

There is also provided an electrolytic apparatus for producing a high-purity titanium by electrolyzing, in fused salt, a raw material consisting of metallic titanium, wherein a cathode is located at a central portion of the electrolytic cell, at least one anode is separated from the cathode, and an electrically insulating plate covers the bottom of the electrolytic cell.

The alkali metals herein indicate metal belonging to the 1A group of the Periodic Table and are represented by Na, K and Li. The radio active elements herein indicate elements having radio activity and are represented by U and Th. The heavy metals herein include Fe, Cr, Ni, Mn and the like having relatively heavy atomic weight.

DESCRIPTION OF THE PREFERRED EMBODIMENTS

The high-purity nickel used in the present invention has a purity of from 3N (99.9 wt %) to 4N (99.99 wt %). This nickel is used for constructing at least some portions or members of an electrolytic cell being in contact with the fused salt. Such portions or members include a crucible, basket of sponge titanium, anode, cathode, inner wall of the cell, protective tube of a thermometer, and the like. The vapor of fused salt may attach on the top wall of an electrolytic cell to form the droplets and they may fall down into the bath of fused salt, thereby causing the impurity-contaminating source. It is, therefore, preferable that the inner wall of the apparatus exposed to the vapor of fused salt preferably consists of nickel. The term "consist(s)" herein means not only that the portions or members themselves are made of nickel, but also means that the surface of the portions or members is lined with or coated with nickel. The coating method is, for example, plating.

Ceramics having a high density and a high purity, such as alumina, magnesia and zirconia plates are appropriate for the o electrically insulating plate, which covers the bottom of the electrolytic cell in accordance with the present invention. Such insulating plates do not directly react with NaCl, KCl, $TiCl_2$, $TiCl_3$ and Ti, and, therefore, the electrolytically deposited Ti is not contaminated by the insulating plates.

In the electrolytic refining operation of titanium, chlorides, generally, KCl-NaCl, LiCl-KCl, and NaCl, all having stability, low melting point, and high electro-conductivity, are used as the fused salt. The basket, in which sponge titanium is contained, is connected to the anode side, while the electrolytic titanium is deposited on the cathode. When the average Ti atomic valence of the electrolytic bath is in the range of from 2.1 to 2.3, electrolysis is carried out satisfactorily so that dendritic, large crystalline titanium including six-sided plates with high purity, is deposited. In order to attain the above atomic valence, $TiCl_4$ is introduced into the bottom of sponge titanium, thereby advancing the following reactions.

$$TiCl_4 + Ti \rightarrow 2\ TiCl_2 \qquad (1)$$

$$TiCl_2 + TiCl_4 \rightarrow 2\ TiCl_3 \qquad (2)$$

TiCl$_2$ and TiCl$_3$ are, therefore, formed in the NaCl bath. The reaction (1) is the principal reaction. The concentration of TiCl$_2$ formed by the reaction (1) is 5–6% by weight in the bath. The concentration of TiCl$_3$ formed by the reaction (2) is 1.3–1.8% by weight in the bath. The average of these chlorides is TiCl$_{2.1-2.3}$. The average atomic valence so obtained in the range of from 2.1 to 2.3 is an important factor in the electrolytic refining.

DESCRIPTION OF THE PREFERRED EMBODIMENTS

Figure 1:
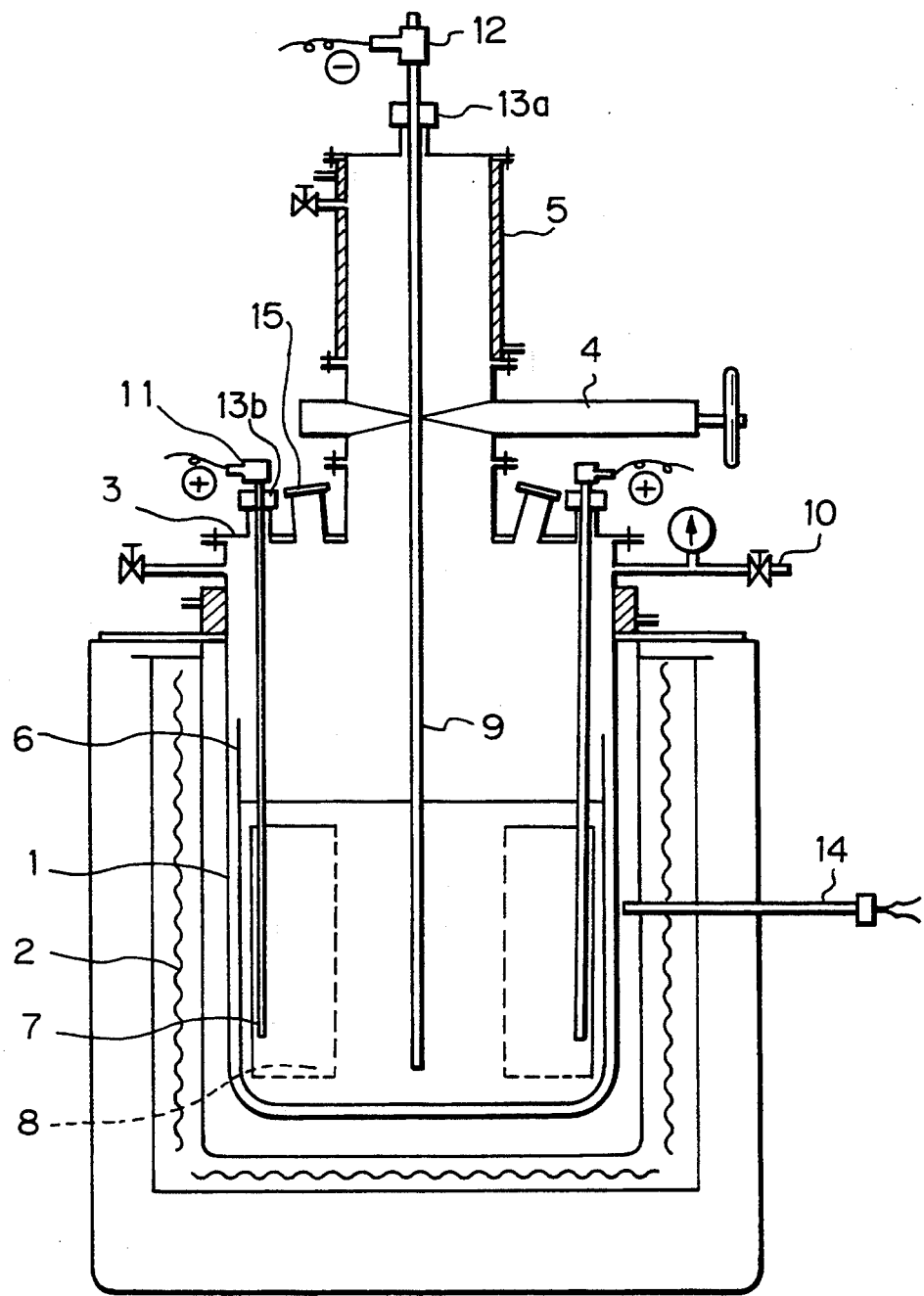
FIG. 1 is a front view of the fused salt electrolytic apparatus according to an embodiment of the present invention.

Referring to FIG. 1, the electrolytic cell 1 is set in an electric heater 2. The cell cover 3 is mounted on the top of the electrolytic cell 1 by using a seal, such as a rubber 0 ring (not shown). An upper chamber 5 is installed on the cell cover 3. A gate valve 4 is provided between the upper chamber 5 and the cell cover 3. A crucible 6, which is made of or lined with nickel, is placed in the electrolytic cell 1. Baskets 8 are supported by two anode pipes 7 made of Ni and are suspended in the electrolytic cell 1.

The cathode pipe 9 is made of nickel and is supported in such a manner that it is suspended in the center of the electrolytic cell 1. A conduit 10 for withdrawing the gas in the cell interior or for introducing the inert gas into the cell is formed directly beneath the cell cover 3. The anodes 11 are connected to the anode pipes 7 at their top end, while the cathode 12 is connected to the cathode pipe 9 at its top end. 13a denotes the insulating seal of cathode bar 9, while 13b denotes the insulating seal of anode pipes 7. The thermometer 14, which is inserted into an appropriate protecting tube (not shown), detects the temperature of the electrolytic cell 1. The cell cover 3 is provided with a port 15 for charging or supplementing the sponge titanium therethrough. The summary of the fused salt electrolytic apparatus is as described above. In the present invention, the portions or members brought into contact with the fused salt are the crucible 6, the baskets 8, the anode pipes 7, the cathode bar 9, and the protecting tube of the thermometer, all consisting of nickel. The electrolytic cell 1 and the cell cover 3 per se are made of stainless steel. It is, however, preferred that the upper inner surface of the electrolytic cell 1 and the inner surface of the cell cover 3 be lined with nickel.

An example of the fused salt electrolytic operation is described with reference to FIG. 1.

Refined sodium chloride anhydride (NaCl) in the form of a powder is charged at a predetermined amount in the crucible 6 which is made of nickel. The crucible 6 is then positioned in the electrolytic cell 1, on which the cell cover 3 is tightly attached. The crucible 6 and the electrolytic cell 1 with the cell cover 3 are then set in the electric heater 2.

The NaCl is first fused and then solidified. This is a pretreatment for preventing the oxidation of sponge titanium due to moisture of NaCl. The interior of the electrolytic cell 1 is evacuated through the conduit 10 by means of a vacuum pump. During the evacuation, heating is carried out up to approximately 750° C. by means of the electric heater 2. Moisture in the NaCl can be completely removed by the heating. An inert gas, such as Ar gas, having pressure higher than the atmospheric pressure, is admitted into the electrolytic cell 1 and it (1) is then sealed. Temperature is then elevated higher than the melting point (801° C.) of NaCl, so as to fuse the NaCl. The NaCl is then cooled to a point where it solidifies, keeping the pressure higher than atmospheric pressure.

The cell cover 3 is then opened. To this, cell cover 3 is secured to pipes 7 made of nickel, which support the basket 8, in which the sponge titanium is contained. The cell cover 3 is again set in such a manner that the basket 8 is positioned above the solidified NaCl.

The NaCl is again fused while once more evacuating the cell interior. The inert gas is admitted into the electrolytic cell 1 which is then sealed. The basket, in which sponge titanium is contained, is lowered and immersed in the NaCl bath.

The next operation is then carried out. The TiCl$_4$ (liquid) is introduced at a predetermined flow rate through the pipes 7 by means of a micro-pump, into the bottom of the sponge titanium, thereby advancing the above described reactions (1) and (2). The TiCl$_2$ is formed in the NaCl bath as a result of the principal reaction (1). Simultaneously, the reaction (2) auxiliarily occurs with the result that TiCl$_3$ is formed. It is necessary that the NaCl bath is kept at a sufficiently high temperature for promoting the diffusion of TiCl$_2$. The injection amount of TiCl$_4$ is adjusted so that, ordinarily, TiCl$_2$ is from 5 to 6% by weight, and TiCl$_3$ is from 1.3 to 1.8% by weight in the bath, and, the average of these chlorides is TlCl$_{2.1-2.3}$.

After attaining the chloride compositions as described above, the cathode bar 9 is lowered from the top of the upper chamber 5 until the lower end of the cathode bar 9 is a little above the bottom of the crucible 6. The cathode bar 9 is then fixed at this position. The position of baskets 8 is adjusted by means of the anode bars 7 to a similar position.

The electrolysis is then carried out so as to deposit the titanium connected with the anode 11 on the cathode 12. The current density of the cathode is in the range of from 0.8 to 1.2 A/cm$^2$. The voltage of the electrolytic cell 1 is generally in the range of from 1.0 to 1.4 V. These values, however, are varied considerably depending upon the conditions.

As a result of the electrolysis, titanium, and such impurities as Na, K, U, Th, Mn, and the like having less noble electrode-potential than Ti, are dissolved from the anode. On the other hand, Fe, Cr, Ni, Cu, and the like having more noble electrode potential than Ti, are not dissolved but remain in the anode or fall down as anode slime. The Ti, and metals more noble than Ti, precipitate on the cathode. Since virtually no impurities dissolve from the materials of an electrolytic apparatus according to the present invention, such impurities do not co-precipitate with the Ti.

When the electrolysis is continued for a certain period of time, the cell voltage falls to 0.6–0.8 V. The first electrolytic operation is then completed. While maintaining the temperature of the electrolytic bath, the cathode bar 9 with the precipitated titanium is lifted into the upper chamber 5 and the gate valve 5 is then shut. In order to prevent the electro-deposited titanium from oxidation, it is rapidly cooled by the water-cooled jacket of the upper chamber 5 and is withdrawn from the chamber 5 by disassembling it (5) at the flange above the gate valve 4.

Another cathode bar 9 is set and the second electrolytic operation is carried out by the procedures as described above. The electrolytic operation is repeated in accordance with the amount of sponge titanium. When the amount of sponge titanium, which is the raw material, is decreased, the baskets 8 are lifted above the bath and the sponge titanium is replenished into the baskets 8, while releasing the inert gas into the electrolytic cell to prevent the invasion of air.

The electrolytic operation is carried out while repeating the replenishment of sponge titanium and the replacement of cathode bars. At each time of replenishing the sponge titanium, the $TiCl_2$ and $TiCl_3$ concentrations of the electrolysis bath are analyzed to confirm that the average atomic valency is from 2.1 to 2.3 and the $TiCl_2$ is from 5.5 to 6% by weight. Unless the air is invaded, the average atomic valency and the $TiCl_2$ content do not virtually change during the above described procedures. The electrolysis can therefore readily be continued after the replenishment of sponge titanium.

In order to continuously and stably carry out the electrolysis and to obtain high-purity titanium having a low oxygen content and, hence, a high quality, it is necessary that the oxidizing action due to oxygen-invasion be prevented as described above. Oxygen invasion could occur if there were leaks from the ambient atmosphere into the electrolytic apparatus, or directly from the body of the sponge titanium. The sponge titanium has from 0.7 to 1 kg/l of bulk density, which is very low and which results in a decrease in the charging amount of sponge titanium in the electrolytic cell. This leads to a hindrance in productivity, an increase in the replenishing amount of sponge titanium, and an increase in the danger of air invasion. A high ratio of sponge titanium due to its low bulk density inevitably leads to the accompanying of air with the sponge titanium when it is charged in an electrolytic cell. When the air invades into the normally inert atmosphere, the atomic valence of titanium is detrimentally influenced, and, further, the oxygen content of the electro-deposited titanium is directly increased by such invading oxygen. Therefore, as the bulk density of sponge titanium, which is used as the raw material and replenishing material, is higher, the electrolysis result is better. In a preferred embodiment of the present invention, the sponge titanium is briquetized in metal dies by means of a press. The true density of the briquetized sponge titanium is preferably 3.0 kg/l or more. Note, the true densities of titanium and sponge titanium are 4.5 kg/l and from 0.7 kg/l to 1.0 kg/l, respectively. The briquetizing of sponge titanium is effective not only for a countermeasure against the oxygen invasion but also from a point of view of enhancing the productivity and smooth continuous operation.

As is described in the operation example, the anode pipes are lifted when adjusting the bath and replenishing the sponge titanium. The cathode bar 9 is also lifted when lifting the electro-deposited titanium. When the anode pipes 7 and the cathode bar 9 are slid relative to the insulating seals 13b and 13a, respectively, the air is likely to invade at the insulating seals 13a, 13b. In order to prevent this, a special sealing mechanism is provided in accordance with the present invention so as to seal the anode pipes and the cathode bar.

Figure 2:
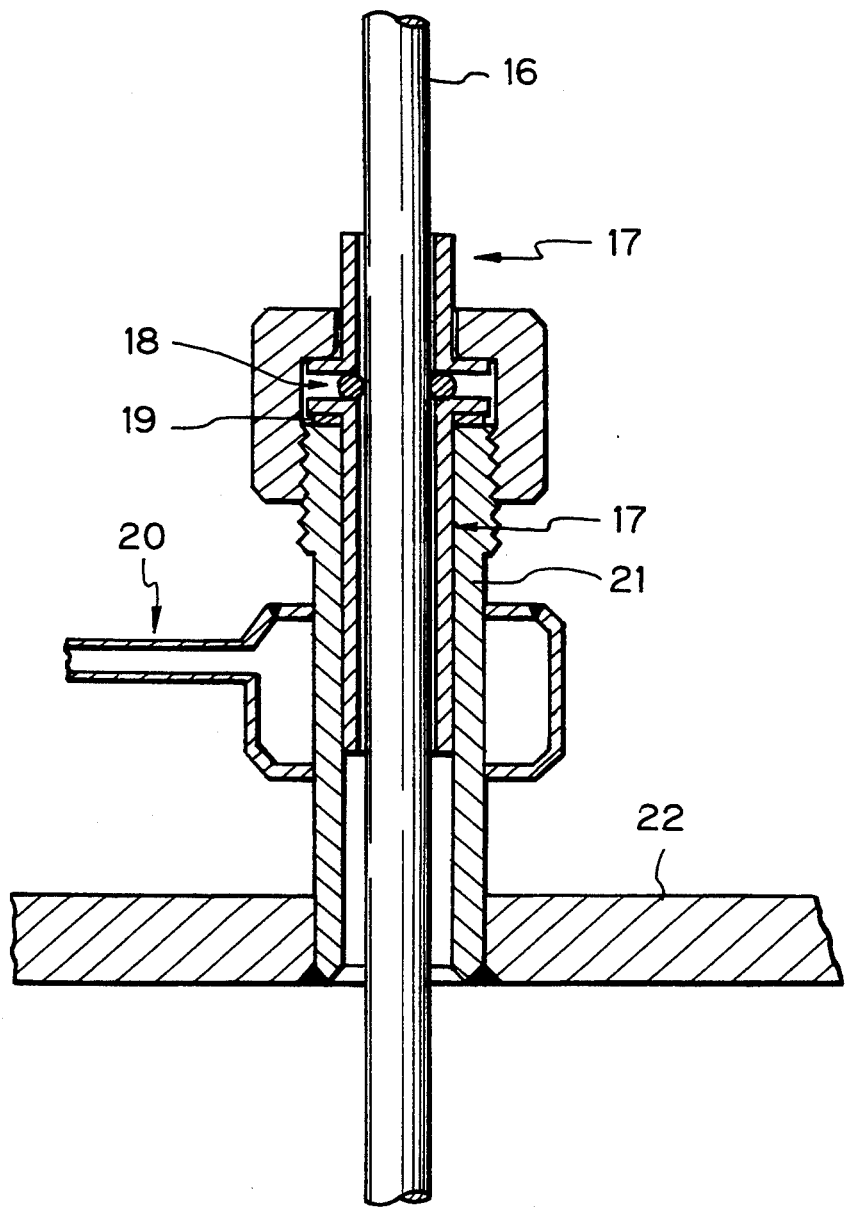
FIG. 2 is a cross sectional view of a pipe and an insulating seal attached at the sliding part of the pipe.

Referring to FIG. 2, an embodiment of the sealing mechanism is illustrated. Reference numeral 16 commonly denotes the anode pipe and the cathode bar. A sleeve 17 made of polytetrafluoroethylene (Teflon, ®Dupont) is inserted between the anode pipe or cathode bar 16 and the pipe 21 which is secured on the flange 22. The sleeve 17, therefore, electrically insulates the pipe 21 from the anode pipe or cathode bar 16 and permits a slidable vertical movement of the anode pipe or cathode bar 16. The sleeve 17 consists of two vertically divided portions, between which the packing, such as the O ring 18, is sandwiched and tightly mounted on the anode pipe or cathode bar 16. A rubber gasket 19 is preferably sandwiched between the top end of the anode pipe or cathode bar and the flanged top of the lower portion of the sleeve 17. The O ring 18, and if applicable the rubber gasket 19, maintain the seal during the vertical movement of the anode pipe or cathode bar 16. A water-cooled jacket 20 is preferably provided so as to protect the sleeve 17 and the 0 ring 18 from thermal damage.

The electro-deposited titanium is withdrawn from the electrolytic cell, water-cooled, pickled and dried in a vacuum. The so obtained high-purity titanium is a mixture of dendritic crystals and six-sided plates. The high-purity titanium is subjected to electron-beam melting or vacuum melting to form an ingot. The ingot is subjected to the conventional processes; i.e., plastic working, such as forging, cutting, and finishing to form a sputtering target. It is necessary to pay attention to the contamination of titanium during this conventional process. The electron-beam melting is preferred because its effect for removing the impurities is great. The high-purity titanium is preferably subjected to a cold pressing process, before the electron-beam melting.

It is possible to form the conductors, thin film and the likes, by means of sputtering the so-obtained target, for example, in argon gas. The sputtering device is preferably a magnetron sputtering device which can yield thin films having the same composition as the target. It is also possible to embed a plurality of Si discs on the surface of a titanium target, thereby enabling the formation of a Ti-Si alloy by sputtering.

Figure 3:
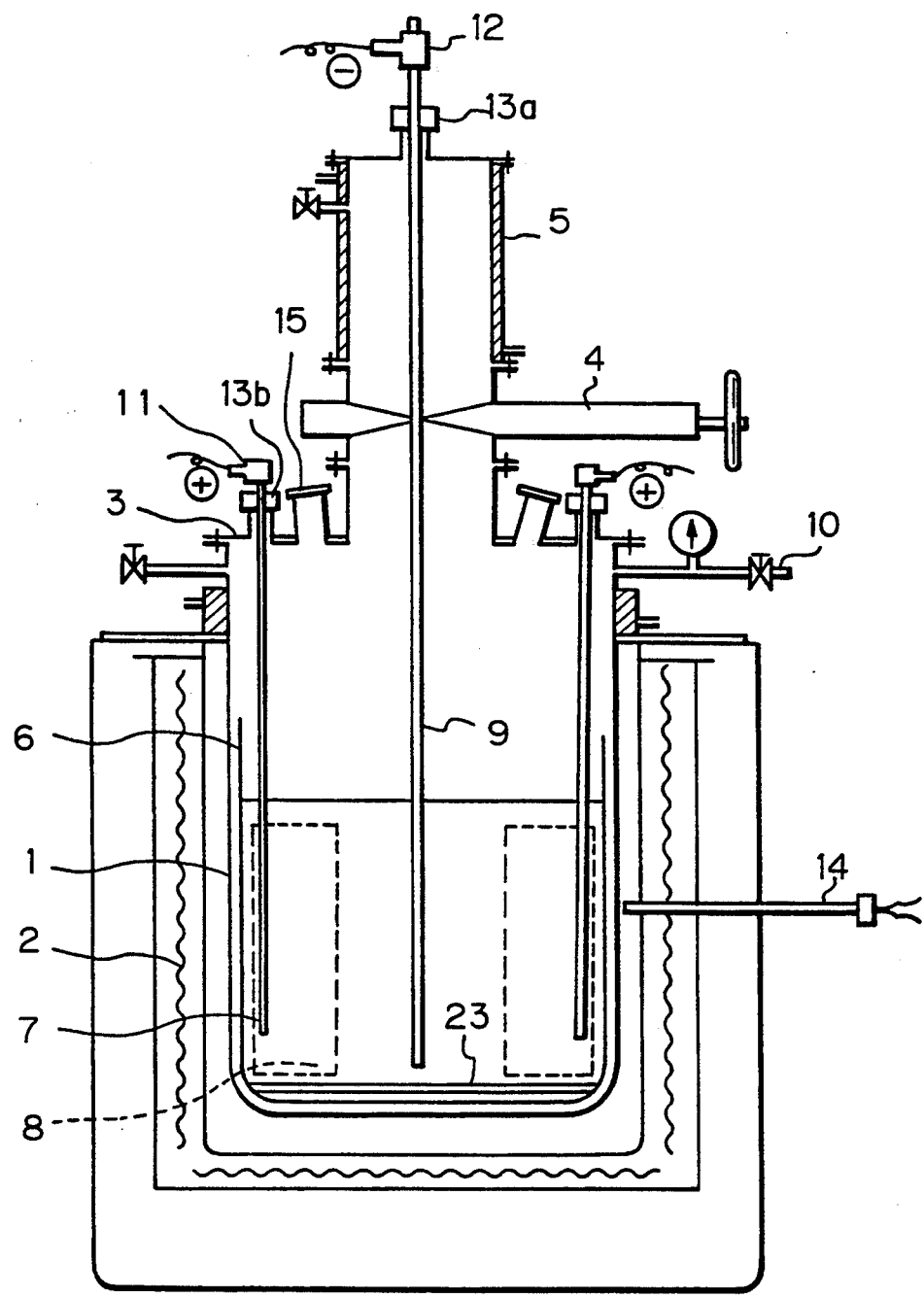
FIG. 3 is a front view of the fused salt electrolytic apparatus according to another embodiment of the present invention.

Referring to FIG. 3, the same portions of an apparatus similar to that shown in FIG. 1 are denoted by the same reference numerals. In the apparatus shown in FIG. 3, a thin alumina plate 23 having a high purity covers the bottom of crucible 6, so that sludge adhesion on the alumina plate 23 becomes difficult, and, even if sludge adhesion does occur, the sludge can be easily removed.

As a result, considerably high current density is obtained.

In the case of the KCl-NaCl bath (melting point =658° C.), the titanium deposited on the cathode is acicular or needle-like and grows in the form of a dendrite. When the electrolysis is advanced and then completed, the space between the cathode and anode, occupied by the deposited titanium becomes greater and amounts to a substantial quantity. Since the specific gravity of Ti, which is 4.5, is greater than that of fused salt, which is 1.5, the titanium deposited on the cathode exhibits some sedimentation and is brought into contact with the bottom of the crucible. This is one reason for greatly decreasing the current density. Such an insulating plate as an alumina plate can prevent the short circuit between the cathode and the crucible. The sludge, which is formed in the salt bath, exhibits sedimentation on the bottom of the crucible, and the sludge accumulated there may adhere to the bottom part of the cathode. The sludge may directly deposit on the cathode, particularly when it is made of Ni.

The sludge must be completely removed from the electro-deposited Ti. Otherwise, the sludge is contained in the electro-deposited titanium, and reduces the purity of the titanium. The insulating plate and the Ti cathode make it difficult for the sludge to deposit or adhere on the cathode. Even if the sludge deposits on the insulating plate and the Ti cathode, the sludge can easily be removed from there. The purity of the electro-deposited Ti does therefore not vary but is stable.

The present invention is hereinafter described with reference to the examples.

EXAMPLE 1

The apparatus shown in FIGS. 1 and 2 was used to refine titanium by fused-salt electrolysis.

Refined sodium chloride anhydride in the form of powder (40 kg) was charged in the crucible 6 made of nickel. The crucible 6 was inserted into an electrolytic cell 1. The cell cover 3 was attached to the electrolytic cell 1 to seal it. The electrolytic cell 1 with the cell cover 3 was set in an electric heater 2.

The pretreatment was carried out. That is, the heating of NaCl up to approximately 750° C. was carried out while evacuating the cell interior by a vacuum pump.

The Ar gas was then admitted into the cell interior until the gauge pressure was 0.1 kg/cm$^2$. The temperature was further elevated up to 850° C. so as to fuse NaCl. The cooling down to approximately 500° C. was carried out while keeping the pressure above atmospheric pressure.

An amount of 20 kg of sponge titanium was placed in the basket 8 made of a perforated Ni plate (diameter of holes—3 mm). The basket 8 was supported by pipes 7 made of nickel. After opening the cell cover 3, the pipes 7 were secured on the cell cover 3. The cell cover 3 was again attached to the electrolytic cell 1, so that the basket 8 was placed above the solidified NaCl.

The NaCl was again fused while evacuating the cell interior. The inert gas was admitted into the electrolytic cell 1 and it was then sealed. The basket 8 was then lowered and immersed in the NaCl bath 7. The TiCl$_4$ was introduced at a flow rate of 15 g per minute for 2.5 hours through the pipes 7 into the bottom of the sponge titanium. As a result, the TiCl$_2$ and TiCl$_3$ contents in the bath were 5.5% by weight and 1.5% by weight, respectively. The average atomic valence was, therefore, between 2.1 and 2.2.

The lower ends of the cathode bar 9 and the basket 8 were set 3 cm distant from the bottom of crucible 6. The electrolysis was carried out at a current density of 1.0 A/cm$^2$ and a cell voltage of 1.2 V.

After the current conduction of approximately 70 hours, the cell voltage was reduced to 0.6–0.8 V. The first electrolysis operation was then completed.

While maintaining the temperature of the electrolytic bath at 850° C., the cathode bar 9 was lifted together with the electro-deposited titanium into the upper chamber 5. The gate valve 4 was shut. The electro-deposited titanium was cooled to 50° C. in the upper chamber 5. The electro-deposited titanium was about 5 kg in weight and consisted mainly of dendritic crystals with some six sided plates approximately 1 cm in diameter. The electrodeposited titanium was water-rinsed and then pickled in 5% HCl, followed by drying in a vacuum. High-purity titanium was thus obtained.

Electrolysis was carried out intermittently three times. The basket 8 was then lifted above the bath and 15 kg of titanium briquettes were replenished. The electrolysis could be continued after replenishment as it was.

The analysis values of sponge titanium and the electro-deposited titanium were as follows.

TABLE 1

| Elements | Sponge Titanium (ppm) | Electro-deposited Titanium (ppm) |
|---|---|---|
| Na | — | 70 |
| K | — | <0.02 |
| Mg | 100 | <0.1 |
| Al | 20 | 0.1 |
| Fe | 100 | 0.2 |
| Cr | 10 | 0.2 |
| Ni | 20 | 0.1 |
| Cu | 6 | <0.1 |
| Mn | 20 | <1 |
| Sn | 30 | <0.5 |
| U | — | <1 ppb |
| Th | — | <1 ppb |
| O | 250 | 80 |
| H | 30 | <10 |
| N | 30 | <10 |

EXAMPLE 2

The same method as in Example 1 was carried out using the apparatus shown in FIG. 3. However, the cathode bar 9 was made of titanium. The analysis values of sponge titanium and electro-deposited titanium are shown in Table 2.

In the present example, a fired, high-purity alumina plate (density—99.8%, thickness—3 mm, a commercially available product) was used to cover the bottom of the crucible without any clearance between the alumina plate and crucible. The current efficiency on the cathode side is shown in Table 3 with regard to the present example and the comparative method without the insulating plate, that is, the method of Example 1. The theoretical amount of Ti$^{2+}$ deposited with calculated from the actual electrical quantity (ampere.hour), and the ratio of the electro-deposited amount relative to the theoretical deposited amount is shown as the current efficiency.

The electro-deposited titanium was melted by an electron-beam furnace. The analysis values of the electron-beam (EB) melted ingot are shown in Table 2. The purity of EB ingot is 6N except for the gaseous components.

TABLE 2

| Elements | Sponge Titanium (ppm) | Electro-deposited Titanium (ppm) | EB ingot (ppm) |
|---|---|---|---|
| Na | — | 70 | <0.02 |
| K | — | 0.3 | <0.02 |
| Mg | 100 | <0.1 | <0.05 |
| Al | 10 | 0.1 | <0.1 |
| Fe | 100 | <0.05 | <0.05 |
| Cr | 10 | <0.1 | <0.1 |
| Ni | 20 | <0.05 | <0.05 |
| Cu | 6 | <0.1 | <0 1 |
| Mn | 20 | 1 | <0.1 |
| Sn | 30 | <0.5 | <0.1 |
| U | — | <1 ppb | <1 ppb |
| Th | — | <1 ppb | <1 ppb |
| O | 250 | 80 | 90 |
| H | 30 | <10 | <10 |
| N | 30 | <10 | 1 |

TABLE 2-continued

| Elements | Sponge Titanium (ppm) | Electro-deposited Titanium (ppm) | EB ingot (ppm) |
|---|---|---|---|
| Co | 10 | <0.1 | <0.1 |
| C | 20 | <10 | <10 |

TABLE 3

| | Comparative Method (without insulating plate) | | | Inventive Method (with insulating plate) | | |
|---|---|---|---|---|---|---|
| | Actual Electrical Quantity | Electro-deposited amount | Current Efficiency | Actual Electrical Quantity | Electro-deposited amount | Current Efficiency |
| | AH | g | % | AH | g | % |
| 1 | 11,123 (9,944) | 5,121 | 51.5 | 10,903 (9,747) | 5,975 | 61.3 |
| 2 | 11,421 (10,210) | 5,003 | 49.0 | 9,447 (8,446) | 5,135 | 60.8 |
| 3 | 11,047 (9,876) | 4,760 | 48.2 | 9,376 (8,382) | 4,904 | 58.5 |
| 4 | 9,626 (8,606) | 4,105 | 47.7 | 9,377 (8,383) | 4,322 | 57.3 |
| 5 | 9,248 (8,268) | 3,828 | 46.3 | 8,175 (7,308) | 4,107 | 56.2 |

While the invention has been particularly shown and described in reference to preferred embodiments thereof, it will be understood by those skilled in the art that changes in form ad details may be made therein without departing from the spirit and scope of the invention.

We claim:

1. A method for producing a high-purity titanium having a purity of at least 5N, except for gaseous impurities, and having an oxygen content of less than 100 ppm, by electro-refining, comprising the steps of:
   forming a fused salt in an electrolytic apparatus comprising members which are brought into contact with the fused salt and which consist of a high purity nickel having a purity of at least 3N, and a cover which comprises in its inner surface a high-purity nickel having a purity of at least 3N;
   preparing a raw material of titanium consisting of metallic material;
   connecting the raw material with an anode; and
   electrolyzing the raw material in the fused salt at a temperature higher than 658° C., wherein the raw material of titanium has a purity of from 99.9 wt % to 99.99 wt %.

2. A method for producing a high-purity titanium according to claim 1, wherein the raw material of titanium has a purity of from 3N to 4N.

3. A method for producing a high-purity titanium according to claim 1, wherein the fused salt is formed by heating the salt to completely remove moisture therefrom, melting the salt, and then cooling so that the salt solidifies.

4. A method for producing a high-purity titanium according to claim 1, further comprising the step of rapidly cooling the obtained electro-deposited titanium.

5. A method for producing a high-purity titanium according to claim 1, wherein the raw material of titanium is briquetized.

6. A method for producing a high-purity titanium having a purity of at least 5N, except for gaseous impurities, and having an oxygen content of less than 100 ppm, by electro-refining, comprising the steps of:
   preparing a raw material of metallic titanium;
   connecting the raw material with an anode;
   forming a fused salt in an electrolytic apparatus comprising: members which are brought into contact with the fused salt and which consist of high-purity nickel having a purity of at least 3N, a cover which comprises in its inner surface of high-purity nickel having a purity of at least 3N, and a cathode which consists of titanium; and
   electrolyzing the raw material in the fused salt at a temperature higher than 658° C., wherein the raw material of titanium has a purity of from 99.9 wt % to 99.99 wt %.

7. A method for producing a high-purity titanium according to claim 6, wherein the raw material of titanium has a purity of from 3N to 4N.

8. An apparatus for producing a high-purity titanium having a purity of at least 5N, except for gaseous impurities, and having an oxygen content of less than 100 ppm, by fused-salt electrolysis, comprising an electrolytic cell, an anode, a cathode and a cover of the electrolytic cell, wherein members of said apparatus which are in contact with the fused salt, and the cover of the apparatus consist of high-purity nickel having a purity of at least 3N.

9. A method for producing a high-purity titanium according to claim 8, further comprising:
   a slidable contact with an electrode in the form of a bar, or a bar, which is in slidable contact with an electrode in the form of a pipe;
   a sleeve member comprising portions divided in the direction of the electrode, each portion consisting of polytetrafluoroethylene, inserted at the contact part between the electrode and the pipe or bar, for electrically insulating therebetween at the contact part; and
   a packing sandwiched between the divided portions of the sleeve member.

10. A method for producing a high-purity titanium according to claim 8, wherein the cathode is located at a central part of the electrolytic cell and consists of titanium.

11. An apparatus according to claim 8, further comprising a pipe, which is in slidable contact with an electrode in the form of a bar, or a bar, which is in slidable contact with the electrode in the form of a pipe;
   a sleeve member comprising portions divided in the direction of the electrode, each portion consisting of polytetrafluoroethylene, inserted at the contact part between the electrode and the pipe or bar, for electrically insulating therebetween at the contact part; and
   a packing sandwiched between the divided portions of the sleeve member.

12. An apparatus for producing a high-purity titanium having a purity of at least 5N, except for gaseous impurities, and having an oxygen content of less than 100 ppm, by fused-salt electrolysis, comprising an electrolytic cell, an anode, a cathode located at a central part of the electrolytic cell, and a cover of the electrolytic cell, wherein parts of said apparatus which are in contact with the fused salt, and the cover, consist of high-purity nickel having a purity of at least 3N.

13. An apparatus according to claim 12, comprising a pipe which is in slidable contact with the electrode in the form of a bar, or a bar, which is in slidable contact with an electrode in the form of a pipe;
   a sleeve member comprising portions divided in the direction of the electrode, each portion consisting of polytetrafluoroethylene, inserted at the contact part between the electrode and the pipe or bar, for electrically insulating therebetween at the contact part; and
   a packing sandwiched between the divided portions of the sleeve member.

14. A method for producing a high-purity titanium according to claim 12, wherein the cathode consists of titanium.

15. A fused-salt, electro-refined titanium, having a purity of at least 5N, except for gaseous impurities, and having an oxygen content of less than 100 ppm, produced by the steps of:
   forming a fused salt in an electrolytic apparatus comprising members which are brought into contact with the fused salt and which consist of a high purity nickel having a purity of at least 3N, and a cover which comprises in its inner surface a high-purity nickel having a purity of at least 3N;
   preparing a raw material of titanium consisting of metallic material;
   connecting the raw material with an anode; and
   electrolyzing the raw material in the fused salt at a temperature higher than 658° C., wherein the raw material of titanium has a purity of from 99.9 wt % to 99.99 wt %.

16. A fused-salt, electro-refined titanium according to claim 15, wherein the purity is 6N.

* * * * *